United States Patent
Ueno et al.

(10) Patent No.: US 10,260,027 B2
(45) Date of Patent: Apr. 16, 2019

(54) SUBSTRATE DETERGENT COMPOSITION

(71) Applicant: SHIN-ETSU CHEMICAL CO., LTD., Tokyo (JP)

(72) Inventors: Masaya Ueno, Kanra-machi (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 124 days.

(21) Appl. No.: 15/415,161

(22) Filed: Jan. 25, 2017

(65) Prior Publication Data

US 2017/0130174 A1   May 11, 2017

Related U.S. Application Data

(62) Division of application No. 14/276,329, filed on May 13, 2014, now abandoned.

(30) Foreign Application Priority Data

May 30, 2013 (JP) ................. 2013-114280

(51) Int. Cl.
| | | |
|---|---|---|
| *C11D 3/30* | (2006.01) | |
| *C11D 3/43* | (2006.01) | |
| *C11D 3/44* | (2006.01) | |
| *B08B 3/08* | (2006.01) | |
| *C11D 11/00* | (2006.01) | |
| *H01L 21/762* | (2006.01) | |
| *C11D 3/20* | (2006.01) | |
| *C11D 7/32* | (2006.01) | |
| *C11D 7/50* | (2006.01) | |
| *H01L 21/02* | (2006.01) | |
| *H01L 21/311* | (2006.01) | |
| *H01L 21/683* | (2006.01) | |
| *H01L 21/304* | (2006.01) | |

(52) U.S. Cl.
CPC ............ C11D 11/0047 (2013.01); B08B 3/08 (2013.01); C11D 3/201 (2013.01); C11D 3/2006 (2013.01); C11D 3/2041 (2013.01); C11D 3/2044 (2013.01); C11D 3/2068 (2013.01); C11D 3/30 (2013.01); C11D 7/3209 (2013.01); C11D 7/5022 (2013.01); H01L 21/02057 (2013.01); H01L 21/02074 (2013.01); H01L 21/304 (2013.01); H01L 21/31133 (2013.01); H01L 21/6835 (2013.01); H01L 21/76254 (2013.01); *H01L 2221/68327* (2013.01)

(58) Field of Classification Search
CPC ..... C11D 3/2006; C11D 3/201; C11D 3/2068; C11D 3/2041; C11D 3/2044; C11D 3/30; B08B 3/08

USPC ....... 510/175, 176, 245, 254, 255, 259, 264, 510/504, 505, 506; 134/1.2, 1.3
See application file for complete search history.

(56) References Cited

U.S. PATENT DOCUMENTS

| | | | | |
|---|---|---|---|---|
| 5,977,041 | A * | 11/1999 | Honda ................ | C11D 11/0047 510/175 |
| 6,044,851 | A | 4/2000 | Grieger et al. | |
| 6,652,665 | B1 * | 11/2003 | Sachdev ................ | B08B 3/02 134/19 |
| 9,146,471 | B2 | 9/2015 | Klipp | |
| 2001/0051597 | A1 * | 12/2001 | Kato ........................ | C11D 7/08 510/175 |
| 2002/0000239 | A1 * | 1/2002 | Sachdev ................. | C09D 9/00 134/2 |
| 2006/0003910 | A1 | 1/2006 | Hsu et al. | |
| 2007/0111912 | A1 | 5/2007 | Phenis et al. | |
| 2009/0107520 | A1 | 4/2009 | Lee et al. | |
| 2010/0022426 | A1 | 1/2010 | Yokoi et al. | |
| 2010/0056410 | A1 | 3/2010 | Visintin et al. | |
| 2010/0105595 | A1 | 4/2010 | Lee | |
| 2010/0221503 | A1 | 9/2010 | Pollard et al. | |
| 2010/0304312 | A1 | 12/2010 | Yokoi et al. | |
| 2011/0146724 | A1 * | 6/2011 | Lee ......................... | G03F 7/425 134/26 |
| 2011/0247660 | A1 * | 10/2011 | Lee ......................... | G03F 7/425 134/26 |
| 2012/0058644 | A1 | 3/2012 | Klipp | |
| 2014/0155310 | A1 | 6/2014 | Phenis et al. | |
| 2015/0279666 | A1 * | 10/2015 | Moore ................. | H01L 21/6835 427/154 |

FOREIGN PATENT DOCUMENTS

| | | |
|---|---|---|
| EP | 0875926 A2 | 11/1998 |
| JP | H10-289891 A | 10/1998 |
| JP | 2004-093678 A | 3/2004 |
| JP | 2004-133153 A | 4/2004 |
| JP | 2006-063201 A | 3/2006 |
| JP | WO2009/096480 | 8/2009 |

(Continued)

OTHER PUBLICATIONS

Mar. 2, 2016 US Office Action in U.S. Appl. No. 14/276,329.

(Continued)

*Primary Examiner* — Gregory R Delcotto
(74) *Attorney, Agent, or Firm* — Oliff PLC

(57) ABSTRACT

The invention provides a substrate detergent composition used for cleaning a surface of a substrate, comprising: (A) A quaternary ammonium salt: 0.1 to 2.0% by mass; (B) Water: 0.1 to 4.0% by mass; and (C) An organic solvent: 94.0 to 99.8% by mass. There can be provided a substrate detergent composition used for cleaning a surface of a substrate contaminated with a silicone component whose water contact angle is 100° or more.

10 Claims, No Drawings

(56) References Cited

FOREIGN PATENT DOCUMENTS

| | | |
|---|---|---|
| JP | 2010-250268 A | 11/2010 |
| JP | 2011-216542 A | 10/2011 |
| JP | 2012-017465 A | 1/2012 |
| JP | 2012-526295 A | 10/2012 |
| JP | 2013-010888 A | 1/2013 |
| JP | 2014-133855 A | 7/2014 |
| TW | 201019054 A | 5/2010 |
| TW | 201044124 A | 12/2010 |
| WO | 2010/127941 A1 | 11/2010 |

OTHER PUBLICATIONS

Dec. 27, 2016 Office Action issued in Japanese Application No. 2014-079883.
Mar. 22, 2017 Office Action issued in Taiwanese Patent Application No. 103118812.

* cited by examiner

SUBSTRATE DETERGENT COMPOSITION

This is a Divisional of application Ser. No. 14/276,329 filed May 13, 2014, now abandoned, and claims the benefit of Japanese Application No. 2013-114280 filed May 30, 2013. The entire disclosures of the prior applications are hereby incorporated by reference herein their entirety.

FIELD OF THE INVENTION

The present invention relates to a substrate detergent composition.

DESCRIPTION OF THE RELATED ART

In recent years, finer substrate processing and higher integration technology has further been developed. Specifically, conventional methods for mounting a semiconductor in a 3-dimensional structure are employed to achieve higher density and larger capacity of a substrate. In fact, a 3-dimensional semiconductor-mounting technology is capable of producing a semiconductor obtained by laminating thinned semiconductor chips in a multilayered structure by wire-connecting the same using through silicon vias (TSV).

To achieve this technology, it is necessary to introduce an electrode forming process for thinning a substrate having a formed semiconductor circuit by backgrinding and further forming a TSV-containing electrode on a rear surface.

A system proposed in a substrate-thinning process can be subjected to processes such as a backgrinding process and back side electrodes forming process by bonding a substrate in which a semiconductor circuit is formed on a support substrate such as silicon and glass using an adhesive. In fact, one of its technical requirements is to readily exfoliate the support substrate after completion of the processes, and thereafter it is necessary to remove an adhesive remaining on a substrate surface in which a semiconductor circuit is formed and to complete cleaning of a thin-film semiconductor substrate surface.

Since the above processes are unfortunately subjected to a high temperature of 150° C. or more, a silicone-based heat-resistant adhesive is normally employed. In the meantime, when a substrate surface is cleaned using only an organic solvent for dissolving an adhesive, the water contact angle of the substrate surface is 100° or more. It is thus hard to sufficiently remove the adhesive, Therefore, it was assumed that problems such as unfavorable bonding of an encapsulant are caused in subsequent semiconductor manufacturing processes.

To overcome these technical disadvantages, introduction of a detergent composition capable of sufficiently removing a remaining adhesive with a short period of time without corrosion of a substrate surface is strongly desired. Unfortunately, however, it did not lead to development of a detergent composition capable of sufficiently cleaning a surface of a substrate contaminated with a silicone component with a short period of time (Patent Document 1).

PRIOR ART DOCUMENT

Patent Document

Patent Document 1: Japanese Patent Laid-Open Publication No. 2013-010888

SUMMARY OF THE INVENTION

The present invention was made in view of the above situation, and has an object to provide a substrate detergent composition used for cleaning a surface of a substrate such as a silicon semiconductor substrate, a surface of which is contaminated with e.g. a silicone component whose water contact angle is 100° or more.

To solve the problems as mentioned above, the present invention provides a substrate detergent composition used for cleaning a surface of a substrate, comprising:
(A) A quaternary ammonium salt: 0.1 to 2.0% by mass;
(B) Water: 0.1 to 4.0% by mass; and
(C) An organic solvent: 94.0 to 99.8% by mass.

Use of the above detergent composition can efficiently clean a substrate without corrosion thereof.

Also, the substrate to be cleaned can be a silicon semiconductor substrate whose water contact angle is 100° or more, generally 100 to 120°.

That mostly derives from a silicone-based adhesive composition remaining on the substrate surface, and when an elemental analysis on the substrate surface is executed using X-ray photoelectron spectroscopy device, a content of silicon atom derived from silicone-based adhesive is generally 10% by mass or more, particularly 20% by mass or more related to the entire elements detected before cleaning taken as 100% by mass.

Furthermore, a silicon substrate used in the present application can be used for a thin substrate processing step which is used for a package of compact semiconductor used to wire a silicon substrate in which a circuit is formed with e.g. a metal wiring. A thinning process can be achieved by attaching a laminated body which forms a polymer adhesive on a support body to a silicon substrate which has normal thickness, and by cutting and polishing a back side of the silicon substrate. Illustrative example of the support body includes a glass substrate and a silicon substrate.

Furthermore, an adhesive used for thinning process is not necessary after the process. Therefore, the adhesive is removed by organic solvent, however, particularly a silicone-based adhesive is hard to remove, and the adhesive remains 10% by mass or more on the substrate.

Accordingly, a detergent composition of the present invention can sufficiently clean a silicon semiconductor substrate surface contaminated with a silicone component whose water contact angle is 100° or more with a short period of time. The water contact angle can be determined at less than 100°. Specifically, it is preferable to obtain a substrate whose water contact angle is reduced to 10 to 30°, preferably 10 to 20°. By determining a water contact angle at less than 100°, an effect such as adhesive strength to an encapsulant can be remarkably improved in cases of use for a laminated body of e.g. semiconductor package.

In addition, the quaternary ammonium salt is preferably tetraalkylammonium hydroxide, particularly tetraethylammonium hydroxide.

Accordingly, the quaternary ammonium salt is preferably a quaternary ammonium hydroxide.

Preferably, the organic solvent is an organic solvent containing at least one hydroxyl group in one molecule and contains at least one kind of a saturated aliphatic alcohol having 1 to 8 carbon atoms, a glycol having 2 to 16 carbon atoms and a glycol ether having 4 to 20 carbon atoms.

Accordingly, the substrate detergent composition of the present invention can contain the above-shown organic solvent.

As described above, by cleaning a substrate such as a silicon semiconductor substrate using the substrate detergent composition of the present invention, a favorable cleaning property can be obtained with a short period of time to achieve efficient cleaning of a silicon semiconductor substrate without corrosion thereof, and a durable substrate used for a semiconductor package without corrosion of a substrate surface can be obtained as a thin silicon semiconductor substrate.

DETAILED DESCRIPTION OF THE PREFERRED EMBODIMENTS

The present invention will be described in detail.

As stated above, development of a detergent composition capable of sufficiently cleaning a substrate such as a silicon semiconductor substrate with a short period of time and efficiently and favorably cleaning the same has conventionally been desired.

Inventors of the present invention carried out an extensive investigation to find that a substrate can efficiently be cleaned without corrosion thereof using a detergent composition containing a specific mixture ratio of a quaternary ammonium salt, water and an organic solvent, and the present invention was accomplished.

The present invention will be described in detail, but it is not restricted thereto.

The detergent composition of the present invention used for cleaning a surface of a substrate comprises:
(A) A quaternary ammonium salt: 0.1 to 2.0% by mass;
(B) Water: 0.1 to 4.0% by mass; and
(C) An organic solvent: 94.0 to 99.8% by mass.

Quaternary Ammonium Salt

A quaternary ammonium salt capable of fulfilling the objective of the present invention is e.g. a quaternary ammonium hydroxide and a quaternary ammonium chloride. Illustrative example thereof includes tetraalkylammonium which contains linear alkyl group having 1 to 5 carbon atoms, trialkylhydroxyalkylammonium hydroxide which contains alkyl group having 1 to 5 carbon atoms or hydroxyalkyl group having 1 to 5 carbon atoms, tetramethylammonium hydroxide (TMAH), tetraethylammonium hydroxide (TEAH), tetrapropylammonium hydroxide (TPAH), tetrabutylammonium hydroxide (TBAH), trimethyl(hydroxyethyl)ammonium hydroxide (commonly named as choline), and triethyl(hydroxyethyl)ammonium hydroxide. Preferably used out of the above substances are tetraalkylammonium hydroxide, particularly tetraethylammonium hydroxide (TEAH) in view of cleaning property and stability of a detergent.

Organic Solvent

An organic solvent for fulfilling the objective of the present invention is not particularly restricted, but contains at least one hydroxyl group in one molecule. Illustrative example thereof includes a saturated aliphatic alcohol having 1 to 8 carbon atoms, preferably having 2 to 7 carbon atoms, and more preferably having 3 to 6 carbon atoms; a glycol having 2 to 16 carbon atoms, preferably having 3 to 14 carbon atoms, and more preferably having 5 to 12 carbon atoms; and a glycol ether having 4 to 20 carbon atoms, 4 to 18 carbon atoms, and 4 to 15 carbon atoms, and one or more solvents can be mixed to use. Illustrative example of the saturated aliphatic monohydric alcohol includes methanol, ethanol, n-propyl alcohol, isopropyl alcohol, 1-butanol, 2-butanol, isobutyl alcohol, tert-butyl alcohol, 1-pentanol, 2-pentanol, 3-pentanol, 2-methyl-1-butanol, isopentyl alcohol, sec-butyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, 1-octanol, 2-octanol, 2-ethyl-1-hexanol, cyclohexanol, 1-methylcyclohexanol, 2-methylcyclohexanol, 3-methylcyclohexanol, 4-methylcyclohexanol, and 2-ethylhexyl alcohol. Illustrative example of the glycol includes ethylene glycol, propylene glycol, butylene glycol, hexylene glycol, diethylene glycol, dipropylene glycol, trimethylene glycol, triethylene glycol, tetramethylene glycol, and tetraethylene glycol. Illustrative example of the glycol ether includes ethylene glycol monomethyl ether, ethylene glycol monoethyl ether, ethylene glycol mono n-propyl ether, ethylene glycol mono n-butyl ether, diethylene glycol monomethyl ether, diethylene glycol monoethyl ether, diethylene glycol monopropyl ether, diethylene glycol monobutyl ether, diethylene glycol monohexyl ether, triethylene glycol monomethyl ether, triethylene glycol monoethyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, and 3-methoxy-3-methyl-1-butanol. Preferably used out of the above substances are higher organic solvent having 6 to 12 carbon atoms, particularly propylene glycol monobutyl ether.

To obtain a substrate detergent composition of the present invention, components of a detergent composition can be mixed in no specific manner. The components may be mixed in an optional order, and 2 or 3 components of a basic detergent composition may be blended beforehand. Then, a remaining component may be mixed, or all the components may be mixed altogether.

The detergent composition of the present invention is preferably produced so that troubles such as deposition and liquid separation are not caused.

Specifically, the concentration of a component (A): a quaternary ammonium salt is 0.1 to 2.0% by mass related to the entire components, preferably 0.2 to 1.5% by mass, and more preferably 0.3 to 1.2% by mass. The component (A), if a concentration thereof is under 0.1% by mass, might show an insufficient property of cleaning a thin semiconductor substrate surface. In cases where the concentration exceeds 2.0% by mass, the property of cleaning might not be obtained, resulting in corrosion of a silicon semiconductor substrate.

The concentration of a component (B): water is 0.1 to 4.0% by mass, preferably 0.1 to 3.0% by mass, and more preferably 0.5 to 2.5% by mass. The component (B), if a concentration thereof is under 0.1% by mass, might provide an insufficient property of cleaning a thin semiconductor substrate surface. In cases where the concentration exceeds 4.0% by mass, the property of cleaning might not be obtained, resulting in corrosion of a silicon semiconductor substrate.

The concentration of a component (C): an organic solvent having at least one hydroxyl group in one molecule is 94.0 to 99.8% by mass, preferably 95.5 to 99.7% by mass, and more preferably 96.3 to 99.6% by mass. The component (C), if a concentration thereof is under 94.0% by mass, might fail to dissolve a small amount of an adhesive component, leading to insufficient property of cleaning. In cases where the concentration exceeds 99.8% by mass, the effect of cleaning cannot be obtained.

As stated above, the detergent composition can be produced by determining an optimal ratio of concentrations of all the components, and other components can optionally be added.

The detergent composition of the present invention is not restricted to a silicon semiconductor substrate, but to a germanium substrate, a gallium-arsenic substrate, a gallium-phosphorus substrate, a gallium-arsenic-aluminum substrate, an aluminum-plated silicon substrate, a copper-plated silicon substrate, a silver-plated silicon substrate, a gold-plated silicon substrate, a titanium-plated silicon substrate, a silicon nitride film-forming silicon substrate, a silicon oxide film-forming silicon substrate, a polyimide film-forming silicon substrate, glass substrate, a quartz substrate, a liquid crystal substrate, and an organic EL substrate.

The present invention which can clean a substrate having normal thickness is particularly effective to a thin substrate processed and cut whose thickness is preferably 20 to 100 μm, more preferably 20 to 70 μm.

As a cleaning method, a substrate remaining organic matter such as a silicone resin can be cleaned by immersed in or sprayed with a detergent composition of the present invention, preferably washed and dried for 30 seconds to 30 minutes, more preferably 1 to 10 minutes. Furthermore, in some cases, it may be heated in view of dispersibility.

Furthermore, the obtained substrate without corrosion further can be performed plating and sputtering treatment, and used for a compact semiconductor package.

EXAMPLE

The present invention will be described in more detail with reference to Examples and Comparative Examples, but the present invention is not restricted thereto.

Production of a Substrate

An adhesive layer was formed on an 8-inch silicon semiconductor substrate (200 mm in diameter, thickness: 725 μm) with a film thickness of 10 μm by a spin-coating method, using a silicone resin nonane solution adhesive. Using an 8-inch glass substrate (a glass wafer) as a support substrate, the support substrate and a silicon semiconductor substrate having an adhesive layer were bonded in a vacuum bonding device at 200° C. to produce a laminated body composed of the wafer, the adhesive layer and the support substrate. Thereafter, a back side of the silicon semiconductor substrate was ground using a grinder, so that the final thickness of the substrate was 50 μm. Subsequently, the silicon semiconductor substrate in a laminated substrate was horizontally fixed and the support substrate was exfoliated. Afterward, the support substrate was immersed in a nonane solution for 6 minutes, and the adhesive layer was removed and dried to produce a cleaning-test silicon semiconductor substrate. At that time, a water contact angle of the substrate surface was 108°, and an elemental analysis on the substrate surface by X-ray photoelectron spectroscopy device showed a content of silicon atom was 23%. Note that silicon derived from silicon substrate was excluded from the content of silicon atom.

Example 1

A TMAH pentahydrate (4 g), water g) and a 1-butoxy-2-propanol (95 g) were prepared into a 500 ml flask equipped with an agitator, a cooling unit and a thermometer, agitated at room temperature and the TMAH pentahydrate was dissolved to obtain a detergent composition "A".

Example 2

A 25% TPAH aqueous solution (4 g) and a 1-propoxy-2-propanol (96 g) were prepared into a 500 ml flask equipped with an agitator, a cooling unit and a thermometer, and uniformly agitated at room temperature to obtain a detergent composition "B".

Example 3

A 37% TBAH methanol solution (2.7 g), water (0.3 g) and a 1-butanol (97 g) were prepared into a 500 ml flask equipped with an agitator, a cooling unit and a thermometer, and uniformly agitated at room temperature to obtain a detergent composition "C".

Example 4

A 35% TEAH aqueous solution (1.5 g) and a 1-butoxy-2-propanol (98.5 g) were prepared into a 500 ml flask equipped with an agitator, a cooling unit and a thermometer, and uniformly agitated at room temperature to obtain a detergent composition, "D".

Example 5

A 35% TEAH aqueous solution (1.5 g), water (0.5 g), a 1-hexanol (49 g) and a 1-butoxy-2-propanol (49 g) were prepared into a 500 ml flask equipped with an agitator, a cooling unit and a thermometer, and uniformly agitated at room temperature to obtain a detergent composition "E".

Example 6

A 35% TEAH aqueous solution (2.86 g), water (0.14 g), a dipropylene glycol (48.5 g) and a 1-butoxy-2-propanol (48.5 g) were prepared into a 500 ml flask equipped with an agitator, a cooling unit and a thermometer, and uniformly agitated at room temperature to obtain a detergent composition "F".

Example 7

A 35% TEAR aqueous solution (5.71 g), water (0.09 g), a methanol (47.15 g) and a 1-propoxy-2-propanol (47.15 g) were prepared into a 500 ml flask equipped with an agitator, a cooling unit and a thermometer, and uniformly agitated at room temperature to obtain a detergent composition "G".

Comparative Example 1

A 35% TEAH aqueous solution (0.14 g), water (0.86 g) and a 1-butoxy-2-propanol (99 g) were prepared into a 500 ml flask equipped with an agitator, a cooling unit and a thermometer, and agitated at room temperature to obtain a detergent composition "H".

Comparative Example 2

A TMAH pentahydrate (6 g), water (2 g) and a 1-butoxy-2-propanol (92 g) were prepared into a 500 ml flask equipped with an agitator, a cooling unit and a thermometer, agitated at room temperature, and the TMAH pentahydrate was dissolved to obtain a detergent composition "I". However, a water layer was separated to obtain no favorable detergent composition.

Comparative Example 3

Water (3 g) and a 1-propoxy-2-propanol (97 g) were prepared into a 500 ml flask equipped with an agitator, a cooling unit and a thermometer, and uniformly agitated at room temperature to obtain a detergent composition "J".

Comparative Example 4

A 10% TMAH propylene glycol solution (5 g) and a 1-butoxy-2-propanol (95 g) were prepared into a 500 ml flask equipped with an agitator, and uniformly agitated at room temperature to obtain a detergent composition "K".

Examples 1 to 7, Comparative Examples 1 to 4

The silicon semiconductor substrate was cleaned by immersed for 6 minutes using the detergent compositions "A" to "K". Each of the detergent compositions was evaluated as follows. Table 1 shows a ratio of each composition and the results.

Appearance

The appearance of each detergent composition was visually confirmed. In confirmation of such problems as precipitation of deposition and separation of a water layer, each case was evaluated, using symbols "o" (no problem found) and "x" (problem found).

Evaluation of a Property of Cleaning a Surface of a Substrate

The silicon semiconductor substrate produced was cleaned using detergent compositions "A" to "H", "J" and "K". Specifically, after the silicon semiconductor substrate was immersed in the detergent compositions "A" to "H", "J" and "K" for a certain period of time, it was washed with pure water for one minute to confirm the water contact angle of a silicon semiconductor substrate surface dried. The water contact angle before cleaning was 108°. In cases where the time required for making the contact angle under 30° was under 6 minutes, the silicon semiconductor substrate surface was evaluated with a symbol of "oo". In cases where the time required for making the contact angle less than 30° was over 6 minutes and under 10 minutes, the silicon semiconductor substrate surface was evaluated with symbols of "o". In cases where the time required for making the contact angle under 30° 10 minutes or more, the silicon semiconductor substrate surface was evaluated with symbols of "x", respectively.

Measurement device: Contact Angle Meter DM-301 manufactured by Kyowa Interface Science Co., LTD.

Water Contact Angle After Cleaning of a Substrate Surface

A produced silicon semiconductor substrate was cleaned using detergent compositions "A" to "H", "J" and "K". Specifically, after the silicon semiconductor substrate was immersed in the detergent compositions "A" to "H", "J" and "K" for 6 minutes, it was washed with pure water for one minute to confirm the water contact angle of a silicon semiconductor substrate surface dried using above-mentioned device.

Substrate Surface Analysis After Cleaning

A produced silicon semiconductor substrate was cleaned using detergent compositions "A" to "H", "J" and "K". Specifically, after the silicon semiconductor substrate was immersed in the detergent compositions "A" to "H", "J" and "K" for 6 minutes, it was washed with pure water for one minute to execute elemental analysis on a silicon semiconductor substrate surface dried using X-ray photoelectron spectroscopy device, and analyze a content of silicon.

Measurement device: AXIS-Ultra DLD manufactured by Kratos Analytical Limited.

TABLE 1

| | Example 1 | Example 2 | Example 3 | Example 4 | Example 5 | Example 6 | Example 7 | Comparative Example 1 | Comparative Example 2 | Comparative Example 3 | Comparative Example 4 |
|---|---|---|---|---|---|---|---|---|---|---|---|
| Detergent composition | A | B | C | D | E | F | G | H | I | J | K |
| TMAH | 2 | | | | | | | | 3 | | |
| TEAH | | | | 0.5 | 0.5 | 1 | 2 | 0.05 | | | 0.5 |
| TPAH | | 1 | | | | | | | | | |
| TBAH | | | 1 | | | | | | | | |
| Water | 3 | 3 | 0.3 | 1 | 1.5 | 2 | 3.8 | 0.95 | 5 | 3 | |
| Methanol | | | 1.7 | | | | 47.1 | | | | |
| 1-butanol | | | 97 | | | | | | | | |
| 1-hexanol | | | | | 49 | | | | | | |
| Propylene glycol | | | | | | | | | | | 4.5 |
| Dipropylene glycol | | | | | | 48.5 | | | | | |
| 1-propoxy-2-propanol | | 96 | | | | | 47.1 | | | 97 | |
| 1-butoxy-2-propanol | 95 | | | 98.5 | 49 | 48.5 | | 99 | 92 | | 95 |
| Appearance | o | o | o | o | o | o | o | o | x | | |
| Contact angle after cleaning | o | o | o | oo | oo | oo | o | x | — | x | |
| Contact angle after cleaning (angle) | 35 | 32 | 35 | 18 | 25 | 23 | 33 | 85 | — | 108 | 63 |
| content of silicon atom after cleaning | 4 | 4 | 3 | <1 | 1 | 1 | 4 | 20 | — | 23 | 17 |

Table 1 shows that in the Examples 1 to 7 that meet requirements of the substrate detergent composition of the present invention, a favorable property of cleaning can be obtained with a short period of time, resulting in no corrosion of a substrate.

Meanwhile, in the Comparative Examples 1 to 4 that don't meet requirements of the substrate detergent composition of the present invention, a favorable property of cleaning cannot be obtained, resulting in corrosion of a substrate.

From these observations, it was confirmed that the substrate detergent composition of the present invention can obtain a favorable property of efficiently cleaning a silicon semiconductor substrate with a short period of time without corrosion of a substrate even in a thin substrate.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A method of cleaning a surface of a semiconductor substrate, the surface being contaminated with a silicone resin and whose water contact angle being 100° or more, comprising: cleaning the surface by using a semiconductor substrate detergent composition, comprising:
   (A) a quaternary ammonium salt: 0.1 to 2.0% by mass;
   (B) water: 0.1 to 4.0% by mass; and
   (C) at least one organic solvent, wherein the at least one organic solvent comprises at least one hydroxyl group in one molecule: 94.0 to 99.8% by mass, to obtain a semiconductor substrate whose water contact angle is reduced to 10 to 30°,
   wherein the semiconductor substrate having the surface to be cleaned is a thin substrate which has been thin-processed to have a thickness of 20 to 100 μm used for a semiconductor package.

2. The method for cleaning a surface of a semiconductor substrate according to claim 1, wherein the silicone resin is an adhesive containing the silicone resin.

3. The method for cleaning a surface of a semiconductor substrate according to claim 1, wherein the method comprises:
   bonding a semiconductor substrate and a support with an adhesive containing the silicone resin to produce a laminated body,
   grinding and processing the semiconductor substrate of the laminated body,
   removing the support and the adhesive from the laminated body to obtain the thin substrate, and
   cleaning the thin substrate by immersing the thin substrate in or spraying the thin substrate with the semiconductor substrate detergent composition.

4. The method for cleaning a surface of a semiconductor substrate according to claim 2, wherein the method comprises:
   bonding a semiconductor substrate and a support with an adhesive containing the silicone resin to produce a laminated body,
   grinding and processing the semiconductor substrate of the laminated body, and
   removing the support and the adhesive from the laminated body to obtain the thin substrate, and
   cleaning the thin substrate by immersing the thin substrate in or spraying the thin substrate with the semiconductor substrate detergent composition.

5. The method for cleaning a surface of a semiconductor substrate according to claim 1, wherein the organic solvent is an organic solvent comprising at least one kind of a saturated aliphatic alcohol having 1 to 8 carbon atoms, a glycol having 2 to 16 carbon atoms or a glycol ether having 4 to 20 carbon atoms.

6. The method for cleaning a surface of a semiconductor substrate according to claim 2, wherein the organic solvent is an organic solvent comprising at least one kind of a saturated aliphatic alcohol having 1 to 8 carbon atoms, a glycol having 2 to 16 carbon atoms or a glycol ether having 4 to 20 carbon atoms.

7. The method for cleaning a surface of a semiconductor substrate according to claim 3, wherein the organic solvent is an organic solvent comprising at least one kind of a saturated aliphatic alcohol having 1 to 8 carbon atoms, a glycol having 2 to 16 carbon atoms or a glycol ether having 4 to 20 carbon atoms.

8. The method for cleaning a surface of a semiconductor substrate according to claim 4, wherein the organic solvent is an organic solvent comprising at least one kind of a saturated aliphatic alcohol having 1 to 8 carbon atoms, a glycol having 2 to 16 carbon atoms or a glycol ether having 4 to 20 carbon atoms.

9. The method for cleaning a surface of a semiconductor substrate according to claim 1, wherein the organic solvent is an organic solvent comprising a saturated aliphatic alcohol having 1 to 8 carbon atoms.

10. The method for cleaning a surface of a semiconductor substrate according to claim 9, wherein the saturated aliphatic alcohol having 1 to 8 carbon atoms is one or more members selected from the group consisting of methanol, ethanol, n-propyl alcohol, isopropyl alcohol, 1-butanol, 2-butanol, isobutyl alcohol, tert-butyl alcohol, 1-pentanol, 2-pentanol, 3-pentanol, 2-methyl-1-butanol, isopentyl alcohol, sec-butyl alcohol, tert-pentyl alcohol, 3-methyl-2-butanol, neopentyl alcohol, 1-hexanol, 2-methyl-l-pentanol, 4-methyl-2-pentanol, 2-ethyl-1-butanol, 1-heptanol, 2-heptanol, 3-heptanol, 1-octanol, 2-octanol, 2-ethyl-1-hexanol, cyclohexanol, 1-methylcyclohexanol, 2-methylcyclohexanol, 3-methylcyclohexanol, 4-methylcyclohexanol, 2-ethylhexyl alcohol, 1-propoxy-2-propanol, 1-butoxy-2-propanol, and 3-methoxy-3-methyl-1-butanol.

* * * * *